United States Patent
Smith et al.

(10) Patent No.: US 11,287,442 B2
(45) Date of Patent: Mar. 29, 2022

(54) CONTINUOUS CALIBRATION OF ACCELEROMETER SENSITIVITY BY PROOF-MASS DITHERING

(71) Applicant: Apple Inc., Cupertino, CA (US)

(72) Inventors: Wesley S. Smith, Mountain View, CA (US); Christopher C. Painter, Dublin, CA (US); See-Ho Tsang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 766 days.

(21) Appl. No.: 16/145,153

(22) Filed: Sep. 27, 2018

(65) Prior Publication Data

US 2019/0277877 A1   Sep. 12, 2019

Related U.S. Application Data

(60) Provisional application No. 62/639,464, filed on Mar. 6, 2018.

(51) Int. Cl.
| | |
|---|---|
| *G01P 15/125* | (2006.01) |
| *G01P 21/00* | (2006.01) |
| *G01P 15/08* | (2006.01) |

(52) U.S. Cl.
CPC ........ *G01P 15/125* (2013.01); *G01P 15/0802* (2013.01); *G01P 21/00* (2013.01); *B81B 2201/0235* (2013.01); *G01P 2015/0868* (2013.01)

(58) Field of Classification Search
USPC .......................................................... 73/1.38
See application file for complete search history.

(56) References Cited

U.S. PATENT DOCUMENTS

| | | | | |
|---|---|---|---|---|
| 5,465,604 | A * | 11/1995 | Sherman | ............... B81C 99/004 73/1.38 |
| 7,640,803 | B1 * | 1/2010 | Gutierrez | ................ G01P 15/14 73/504.04 |
| 8,117,888 | B2 * | 2/2012 | Chan | ........................ G01P 15/18 73/1.38 |
| 9,332,369 | B2 * | 5/2016 | Jenkner | ..................... H04R 1/08 |
| 2007/0240486 | A1 * | 10/2007 | Moore | ................... G01C 21/16 73/1.37 |

(Continued)

*Primary Examiner* — Nathaniel T Woodward
(74) *Attorney, Agent, or Firm* — Fish & Richardson P.C.

(57) ABSTRACT

An in-situ test calibration system and method are disclosed where a perpetual out-of-band electrostatic force induced excitation is used to dither the proof-mass of a MEMS based accelerometer where the amount of deflection change is proportional to sensitivity changes. The supplier of the accelerometer would exercise the accelerometer in a calibration station to determine initial sensitivity values. After the calibration and before removing the accelerometer from the calibration station, the supplier would start the dither and calibrate the acceleration equivalent force ($F_G$) to drive voltage transfer function ($F_G/V$). After installation of the accelerometer into a system or sometime later in the field, any changes in the $F_G/V$ transfer function due to changes in the sensitivity are observable and can be used for re-calibrating the accelerometer.

19 Claims, 6 Drawing Sheets

(56) References Cited

U.S. PATENT DOCUMENTS

| | | | |
|---|---|---|---|
| 2017/0023364 A1* | 1/2017 | Gregory | G01P 15/13 |
| 2017/0328712 A1* | 11/2017 | Collin | H03D 7/00 |
| 2019/0277656 A1* | 9/2019 | Painter | G01C 25/005 |
| 2019/0277877 A1* | 9/2019 | Smith | G01P 15/125 |

\* cited by examiner

CONTINUOUS CALIBRATION OF ACCELEROMETER SENSITIVITY BY PROOF-MASS DITHERING

CROSS-REFERENCE TO RELATED APPLICATION

This application claims priority to U.S. Provisional Patent Application No. 62/639,464, filed Mar. 6, 2018, the entire contents of which are incorporated herein by reference.

TECHNICAL FIELD

This disclosure relates generally to calibrating micro-electrical-mechanical system (MEMS) based accelerometers.

BACKGROUND

The sensitivity of MEMS based accelerometers is normally calibrated by the accelerometer supplier using a known sequence of orientations relative to gravity. The sensitivity, however, is dependent on a number of electromechanical properties that are strain sensitive and/or change over the life of the accelerometer. As a result, the sensitivity shifts after installation into the end-user's system or drifts over the life of the accelerometer. Because the true input stimuli into the accelerometer after installation is not observable, it is difficult to conveniently recalibrate the sensitivity.

SUMMARY

A calibration system and method are disclosed for continuous calibration of accelerometer sensitivity by proof-mass dithering. In an embodiment, a method of calibrating accelerometer sensitivity of a micro-electrical-mechanical system (MEMS) accelerometer comprises: driving a proof mass of the MEMS accelerometer into oscillation using a drive signal oscillating at a drive frequency; converting a change in capacitance of the MEMS accelerometer caused by a deflection of the oscillating proof mass into an analog signal; demodulating the analog signal using a reference signal oscillating at the drive frequency, the demodulating generating an analog sensitivity signal that is proportional to the accelerometer sensitivity; converting the analog sensitivity signal into a digital sensitivity signal; and calibrating a gain of the MEMS accelerometer according to the digital sensitivity signal.

In an embodiment, a calibration system for calibrating acceleration sensitivity of a micro-electrical-mechanical system (MEMS) accelerometer, comprises: a substrate; a proof mass coupled to the substrate; a first pair of electrodes coupled to the substrate and configured to sense capacitance variation in response to a deflection of the proof mass; a second pair of electrodes configured to drive the proof mass into oscillation in response to a drive signal; one of more circuits configured to: generate the drive signal; convert the change in capacitance into an analog signal; demodulate the analog signal using a reference signal oscillating at the drive frequency, the demodulating generating an analog sensitivity signal that is proportional to the accelerometer sensitivity; convert the analog sensitivity signal into a digital sensitivity signal; and calibrate a gain of the MEMS accelerometer according to the digital sensitivity signal.

In an embodiment, an electronic system comprises: a micro-electrical-mechanical system (MEMS) based accelerometer; a calibration system for calibrating acceleration sensitivity of the MEMS based accelerometer, the calibration system comprising: a substrate; a proof mass coupled to the substrate; a first pair of electrodes coupled to the substrate and configured to sense capacitance variation in response to a deflection of the proof mass; a second pair of electrodes configured to drive the proof mass into oscillation in response to a drive signal; one or more circuits configured to: generate the drive signal; convert the change in capacitance into an analog signal; demodulate the analog signal using a reference signal oscillating at the drive frequency, the demodulating generating an analog sensitivity signal that is proportional to the accelerometer sensitivity; convert the analog sensitivity signal into a digital sensitivity signal; and calibrate a gain of the MEMS accelerometer according to the digital sensitivity signal; one or more processors; memory coupled to the one or more processors and storing instructions that when executed by the one or more processors, cause the one or more processors to perform operations comprising: obtaining acceleration data from the MEMS based accelerometer; calculating a location of the electronic system or a step count using the acceleration data; and providing the location or step count to one or more client applications or electronic system components.

In an embodiment, a calibration system for calibrating acceleration sensitivity of a micro-electrical-mechanical system (MEMS) based accelerometer, comprises: a positive electrode; a negative electrode; a first capacitance-to-voltage (C2V) converter coupled to the positive electrode and configured to generate a first voltage signal in response to a change of capacitance of the MEMS based accelerometer; a second C2V converter coupled to the negative electrode and configured to generate a second voltage signal in response to the change of capacitance of the MEMS based accelerometer; a summing amplifier coupled to outputs of the first and second C2V converters and configured to convert the first and second voltage signals into a third voltage signal; a first processing path coupled to the output of the summing amplifier, the first processing path including a first demodulator for demodulating a sense signal from the third voltage signal using a first reference signal having a first frequency, a first analog-to-digital converter (ADC) for converting the sense signal to a digital sense signal and a filter configured to attenuate the digital sense signal at a test signal frequency; and a second processing path coupled to the output of the summing amplifier, the second processing path including a second demodulator for demodulating a sensitivity signal from the third voltage signal using a second reference signal having a second frequency that is lower than a the first frequency, a second ADC for converting the sensitivity signal to a digital sensitivity signal, a feed through store configured to store the output of the second ADC and a subtraction node configured to subtract contents of the feed through store from the sensitivity signal, wherein virtual ground inputs of the first and second C2V converters are coupled to one of two virtual ground voltages by a first switch controlled by a switch signal, and wherein the output of the second ADC is coupled to one of the feed through store or the subtraction node in response to the switch signal.

The details of the disclosed implementations are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

System Overview

An in-situ test calibration system and method are disclosed where a perpetual out-of-band electrostatic force induced excitation is used to dither the proof-mass of a MEMS based accelerometer where the amount of deflection change is proportional to sensitivity changes. The supplier of the accelerometer would exercise the accelerometer in a calibration station to determine initial sensitivity values. After the calibration and before removing the accelerometer from the calibration station, the supplier would start the dither and calibrate the acceleration equivalent force ($F_G$) to drive voltage transfer function ($F_G/V$). After installation of the accelerometer into a system or sometime later in the field, any changes in the $F_G/V$ transfer function due to changes in the sensitivity are observable and can be used for re-calibrating the accelerometer.

Figure 1:
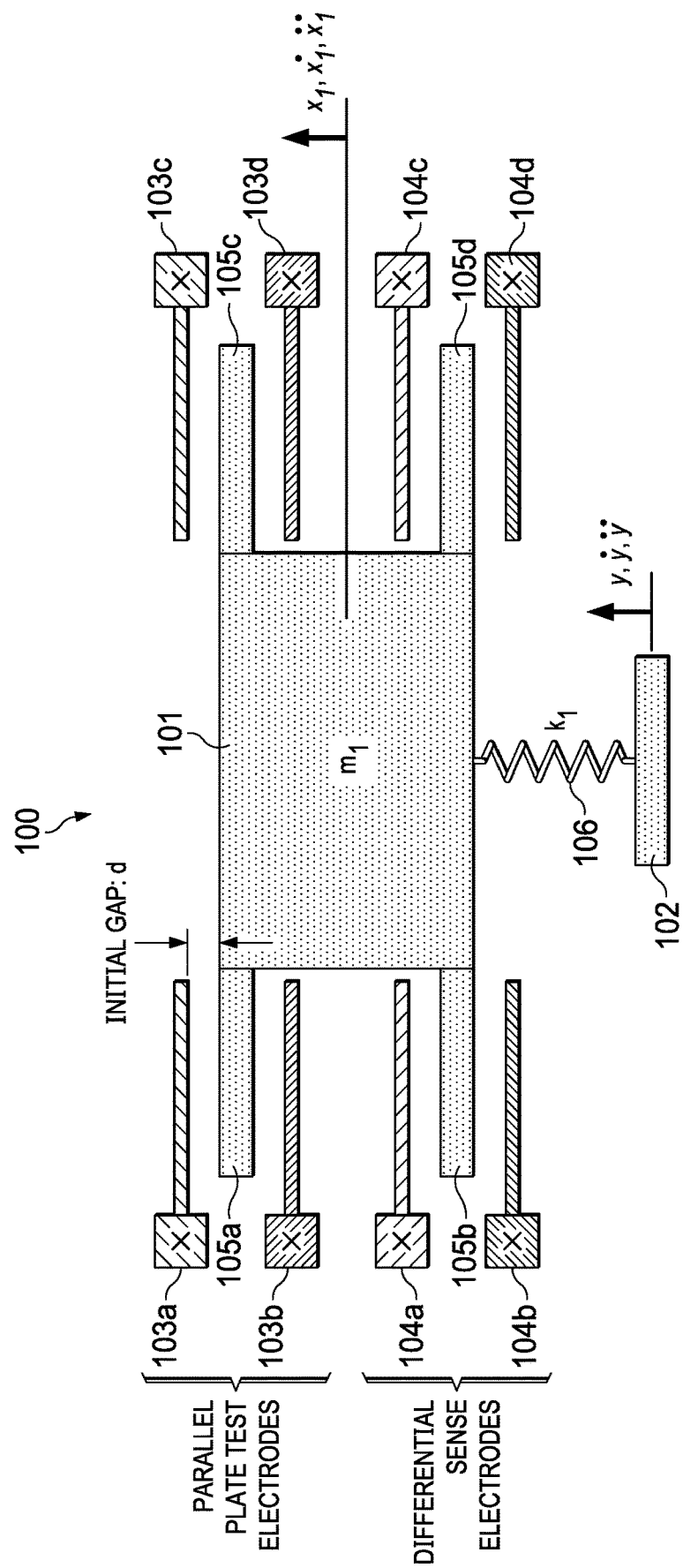
FIG. 1 illustrates a conceptual diagram of a calibration system for a single mass MEMS based accelerometer, according to an embodiment.

FIG. 1 illustrates conceptual diagram of a calibration system 100 for a single mass MEMS based accelerometer, according to an embodiment. System includes proof-mass 101 coupled to substrate 102 by spring 106 having spring constant k1. Finger portion 105a of proof-mass 101 is disposed between parallel plate test electrodes 103a, 103b, and finger portion 105c of proof-mass 101 is disposed between parallel plate test electrodes 103c, 103d. Finger portion 105b of proof-mass 101 is disposed between differential sense electrodes 104a, 104b, and finger portion 105d of proof-mass 101 is disposed between differential sense electrodes 104c, 104d. There is an initial gap "d" between finger portions 105a, 105c and test electrodes 103a, 103c, respectively, and between finger portions 105a, 105c and test electrodes 103b, 103d, respectively. There is also a gap "d" between finger portions 105b and sense electrodes 104a, 104b, and between finger portion 105d and sense electrodes 104c, 104d.

In operation, test electrodes 103a-103d are used to continuously drive proof-mass 101 to oscillate (dither) to allow monitoring of sensitivity of the MEMS based accelerometer. In an example embodiment, proof-mass 101 is driven by test electrodes 103a-103d to continuously oscillate at 500 Hz, where 500 Hz is outside the band of measurement of interest but still on a flat portion of the accelerometer frequency response curve. The gap change due to motion is given by $z=x_1-y$ and the gap change due to initial offset is $z_0$.

Figure 2:
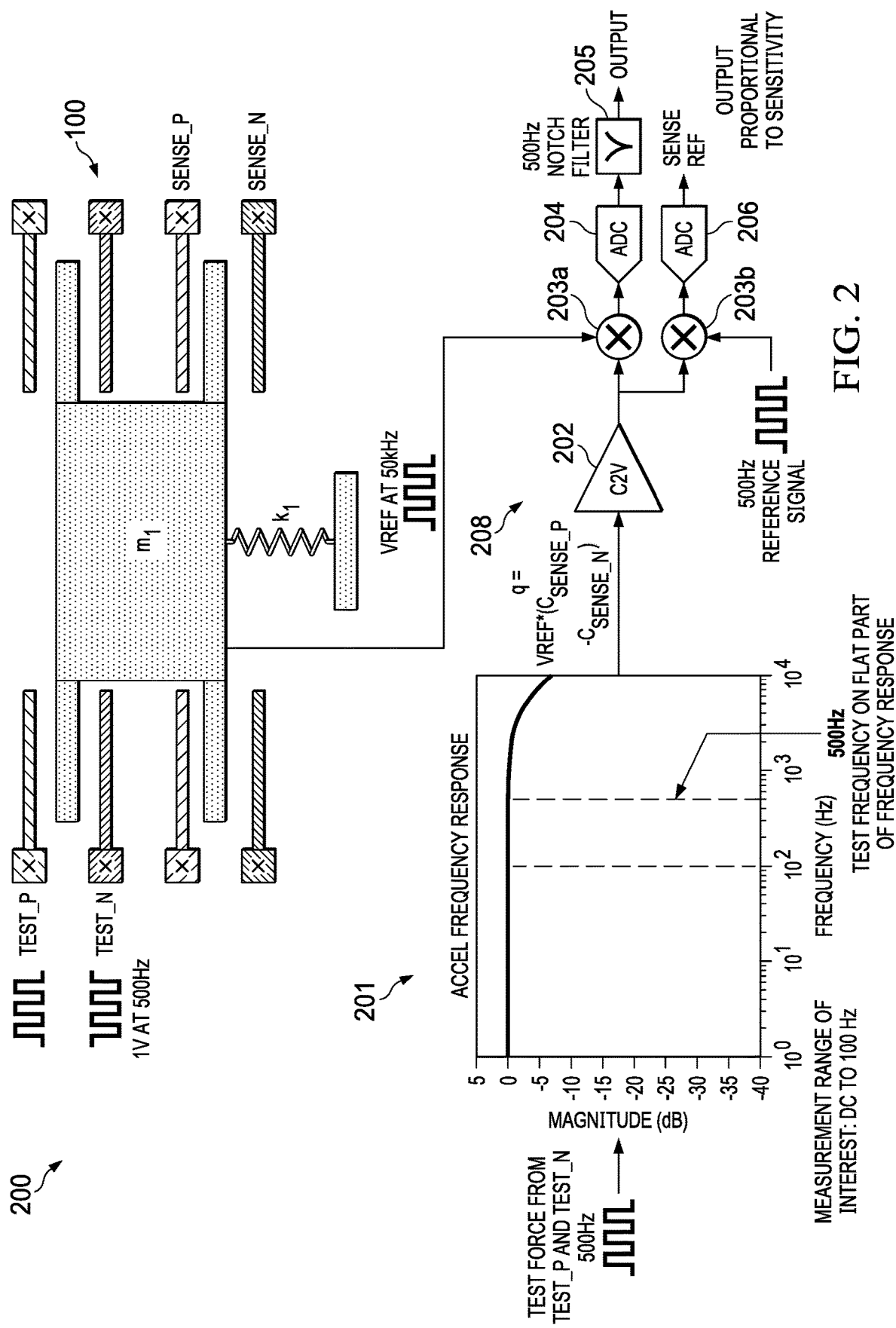
FIG. 2 illustrates continuous calibration of the MEMS based accelerometer of FIG. 1 by proof-mass dithering, according to an embodiment.

FIG. 2 illustrates continuous calibration of the MEMS based accelerometer of FIG. 1 by proof-mass dithering, according to an embodiment. A test signal (e.g., a 500 Hz square wave) is applied to test electrodes 103a-103d as a test force to drive proof-mass 101 into oscillation. The 500 Hz frequency test signal is outside the measurement frequency range of interest (e.g., DC to 100 Hz), but is still on the flat part of the mechanical frequency response curve of the MEMS based accelerometer. The 500 Hz test signal is added through superposition to a reference signal (e.g., a 50 kHz reference signal) used to measure the sense capacitance. The charge "q" on the varying capacitance is input to C2V converter 202 that converts the charge into an analog voltage signal, where q=VREF*($C_{SENSE\ P}-C_{SENSE\ N}$) and VREF is the reference signal used to create the charge q proportional to the sense capacitance to facilitate measurement of acceleration.

The analog voltage signal is processed along two signal processing paths. A first processing path includes demodulator 203a, analog-to-digital (ADC) converter 204 and filter 205. Demodulator 203a demodulates the analog voltage signal into an analog sense signal using VREF (e.g., 50 kHz square wave @ 1V). The analog sense signal is then converted by ADC 204 into a digital sense signal. The digital sense signal is than filtered (e.g., using a 500 Hz notch filter) to attenuate the analog sense signal at 500 Hz contributed by the test signal. The resulting output signal is a digital sense signal that indicates sensed acceleration along a sense axis of the MEMS based accelerometer. A second processing path includes demodulator 203b and ADC 206. Demodulator 203b demodulates the analog voltage signal into an analog sensitivity signal using the 500 Hz test signal. The analog sensitivity signal is then converted by ADC 206 to a digital sensitivity signal that is proportional to the accelerometer sensitivity. The analog sensitivity signal can be stored in memory or a hardware register, and used to calibrate the gain of the MEMS based accelerometer after it has been deployed into the field.

One of the shortcomings of using parallel plate electrodes is that both the accelerometer sensitivity and the acceleration equivalent force ($F_G/V$) are nonlinear functions of the gap change. In reference to FIG. 2, for an accelerometer with a gap change of $z_0$, the accelerometer has positive and negative sense capacitance $C_P$ and $C_N$ given by:

$$C_P = \frac{A\varepsilon_0}{(d-z-z_0)}, \qquad [1]$$

$$C_N = \frac{A\varepsilon_0}{(d+z+z_0)}, \qquad [2]$$

where A is the capacitive plate area, $\varepsilon_0$ is permittivity of space, d is gap distance, and z is the gap change due to motion along the z axis. The accelerometer sensitivity is proportional to the change in capacitance $$\frac{\partial \Delta C}{\partial z},$$

where $\Delta C = C_P - C_N$. The positive ($F_{G,P}$) and negative ($F_{G,N}$) electrostatic force components at the test frequency applied on the proof mass by the positive and negative test electrodes are given as:

$$F_{G,P} = \frac{A\varepsilon_0}{(d-z-z_0)^2} V_B V_{TEST\_P}, \quad [3]$$

$$F_{G,N} = -\frac{A\varepsilon_0}{(d+z+z_0)^2} V_B V_{TEST\_N}, \quad [4]$$

where ($V_B$) is the DC bias between the proof-mass and test electrodes and $V_{TEST\_P}$ and $V_{TEST\_N}$ are AC square wave voltages whose phases are 180° apart applied on the positive and negative test electrodes, respectively. The net sum of the two forces is the acceleration equivalent force $F_G$. It can be observed that both accelerometer sensitivity $$\frac{\partial \Delta C}{\partial z}$$

and $F_G$ depend on the gap change. Because of this, sensitivity changes due to gap and sensitivity changes due to mass or stiffness change cannot be separated using the embodiment described in FIG. 2 alone.

Figure 3A:
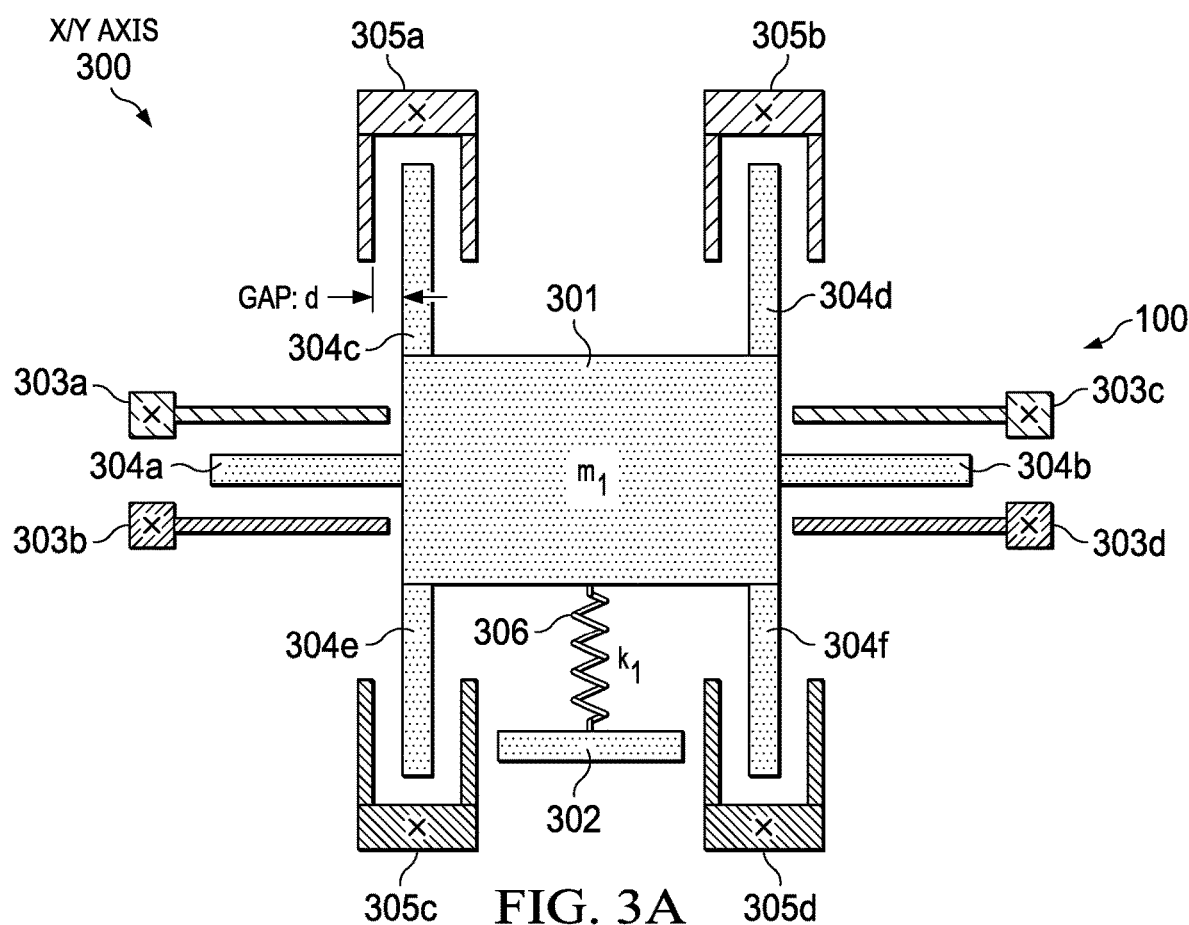
FIG. 3A illustrates an in-plane implementation (X/Y axis) of an alternative calibration system for a MEMS based accelerometer that includes lateral comb test electrodes to improve linearity, according to an embodiment.

FIG. 3A illustrates an in-plane implementation (X/Y axis) of an alternative calibration system for a MEMS based accelerometer that includes lateral comb test electrodes to improve linearity, according to an embodiment. System 300 includes proof-mass 301, substrate 302 and spring 306 ($k_1$). Finger portion 304a of proof-mass 301 is disposed between differential sense electrodes 303a, 303b. Finger portion 304b of proof-mass 301 is disposed between finger portions 303c and 303d. Finger portion 304c of proof-mass 301 is disposed within lateral comb electrode 305a, finger portion 304d of proof-mass 301 is disposed within lateral comb electrode 305b, finger portion 304e of proof-mass 301 is disposed within lateral comb electrode 305c and finger portion 304f of proof-mass 301 is disposed within lateral comb 305d. There is an initial gap space "d" between the finger portions 304c-304f and their respective lateral comb electrodes 305a-305d.

Lateral comb electrodes are inherently more linear as can be observed from the lateral electrostatic force equations:

$$F_{G,P} = \frac{t\varepsilon_0}{d} V_B V_{TEST\_P}, \text{ and} \quad [5]$$

$$F_{G,N} = -\frac{t\varepsilon_0}{d} V_B V_{TEST\_N}, \quad [6]$$

where t is the out-of-plane thickness of the lateral comb electrode. As shown in Equations [5] and [6], the lateral electrostatic force is a function of out-of-plane thickness t and cross-axis gap d, which in an embodiment are designed to be constant parameters.

Figure 3B:
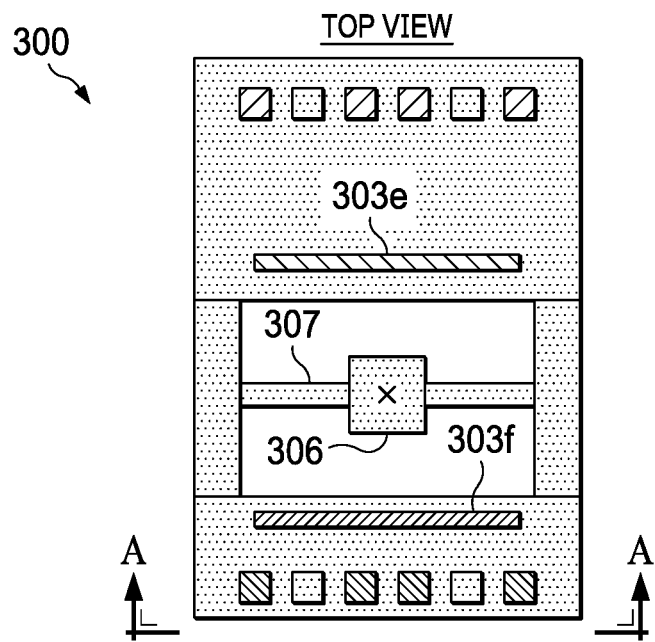
FIG. 3B is a top view of an out-of-plane implementation (Z axis) of an alternative calibration system for a MEMS based accelerometer that includes lateral comb test electrodes to improve linearity, according to an embodiment.

FIG. 3B is a top view of an out-of-plane implementation (Z axis) of an alternative calibration system for a MEMS based accelerometer that includes lateral comb test electrodes to improve linearity, according to an embodiment. Out-of-plane differential sense electrodes 303e, 303f are shown. Also, shown is anchor 306 for anchoring proof-mass 301 to substrate 302 and flexible member 307 (e.g., a torsion bar), which is configured to allow proof-mass 301 to deflect or rotate in response to an external force.

Figure 3C:
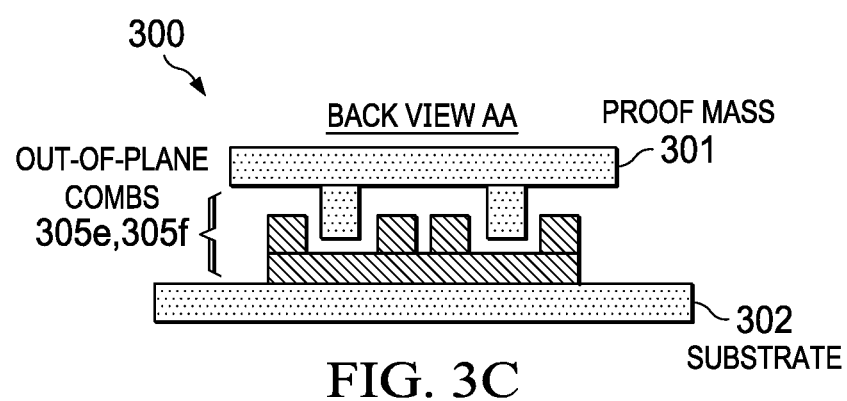
FIG. 3C is a back view of the calibration system of FIG. 3B showing out-of-plane lateral comb test electrodes, according to an embodiment.

FIG. 3C is a back view of the calibration system 300 of FIG. 3A showing out-of-plane lateral comb test electrodes 305e, 305f are shown mounted on substrate 302. Proof-mass 301 is also shown.

Figure 4:
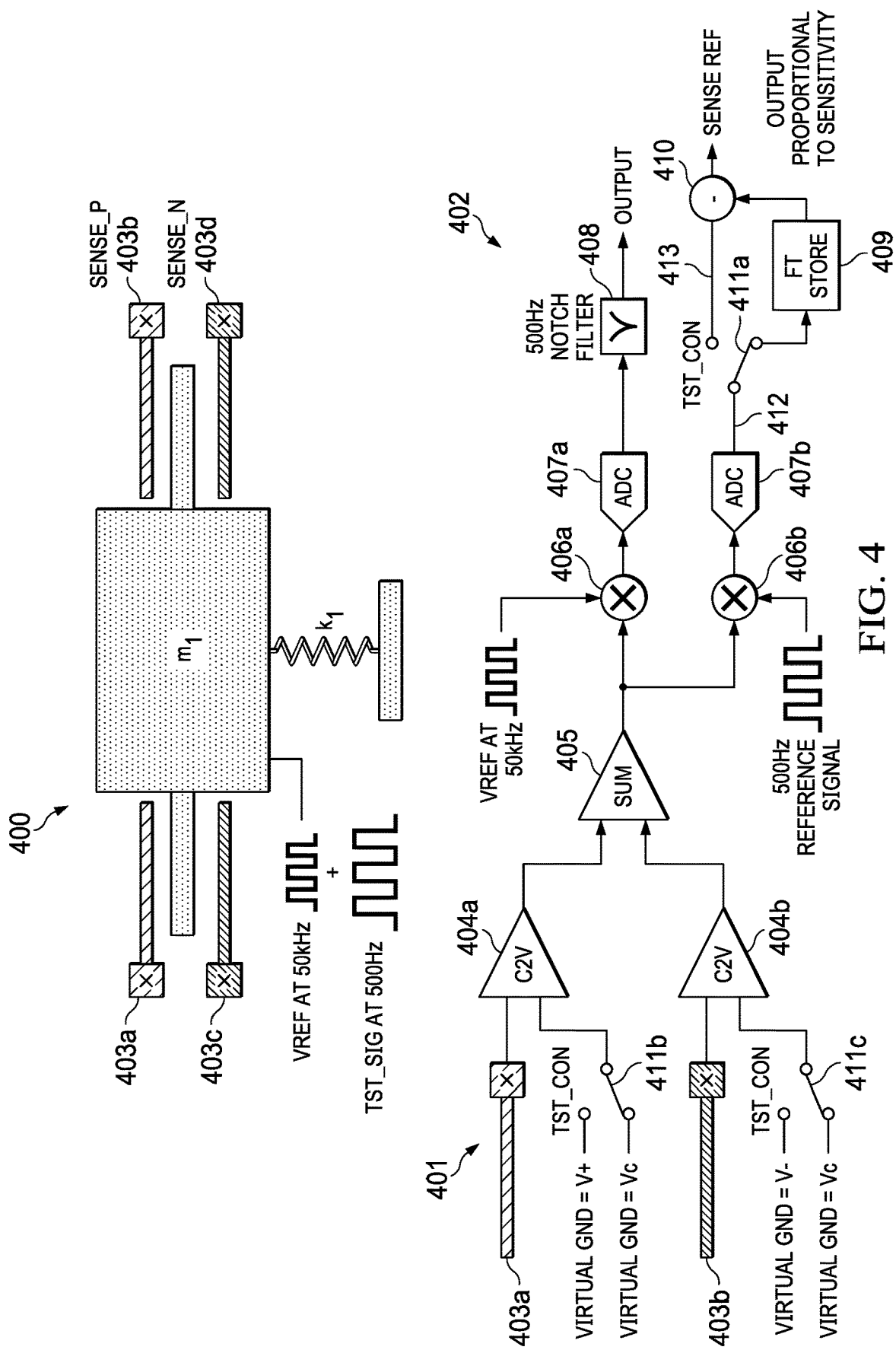
FIG. 4 illustrates a calibration system for continuous calibration of the MEMS based accelerometer of FIG. 1 by proof-mass dithering, wherein a single pair of differential electrodes are used for both testing and measurement, according to an embodiment.

FIG. 4 illustrates a calibration system 400 for continuous calibration of the MEMS based accelerometer of FIG. 1 by proof-mass dithering, wherein a single pair of differential electrodes are used for both testing and measurement, according to an embodiment. Although parallel plate test electrodes are shown, lateral comb test electrodes can also be used in this embodiment.

In this embodiment, circuit 401 includes shared electrodes 403a-403d, C2V converter 404a, C2V converter 404b, summing amplifier 405, demodulator 406a, ADC 407a, filter 408, demodulator 406b, ADC 407b, feed through (FT) store 409 and difference node 410. Switch 411 is configured to switch between line 412 and 413 based in response from a switch signal (TST_CON), which can be implemented in software, hardware or a combination of software and hardware.

In this example embodiment, a first input to C2V converter 404a is coupled to shared positive electrodes 403a and 403b, and the virtual ground of C2V converter 404a is coupled to switch 411b, which is configured to switch between virtual ground V+ or $V_C$ based on a response from the switch signal TST_CON. A first input of C2V converter 404b is coupled to shared negative electrodes 403b and 403c, and a virtual ground of C2V converter 404b is coupled to switch 411c, which is configured to switch between virtual ground V− or $V_C$ based on a response from the switch signal TST_CON. The outputs of C2V converters 404a, 404b are coupled to differential inputs of summing amplifier 405. The output of summing amplifier 405 is input into circuitry 402 that includes two processing paths, as described in reference to the calibration system 200 shown in FIG. 2.

A first processing path includes demodulator 406a, ADC 407a and filter 408 (e.g., a notch filter) that operate in a similar manner to demodulator 203a, ADC 204 and filter 205 (e.g., a notch filter). The second processing path includes demodulator 406b and ADC 407b, which also operate in a similar manner as demodulator 203b and ADC 206 of FIG. 2. The second processing path differs from the second processing path shown in FIG. 2 by adding FT store 409 (e.g., memory), difference node 410 and switch 411.

The electrodes operate in two different modes depending on the value of TST_CON: sense and test. When operating in sense mode, where TST_CON is high, switch 411 connects line 412 to FT storage 409, the virtual grounds on 404a and 404b are both coupled to $V_C$, there is no sensitivity output on Sense REF and the capacitive feed through value is being measured and stored in FT storage 409.

When operating in test mode, where TST_CON is low, switch 411 couples line 412 to line 413, the virtual ground on 404a is connected to V+, the virtual ground on 404b is coupled to V−, the feed through is being subtracted out by difference node 410 and the compensated test signal proportional to sensitivity is being output on Sense REF.

An advantage of sharing electrodes is that a second pair of test electrodes are not needed, which may reduce the cost of manufacture and/or simplify integration of the calibration system 400 into existing designs for MEMS based accelerometers.

Example Processes

Figure 5:
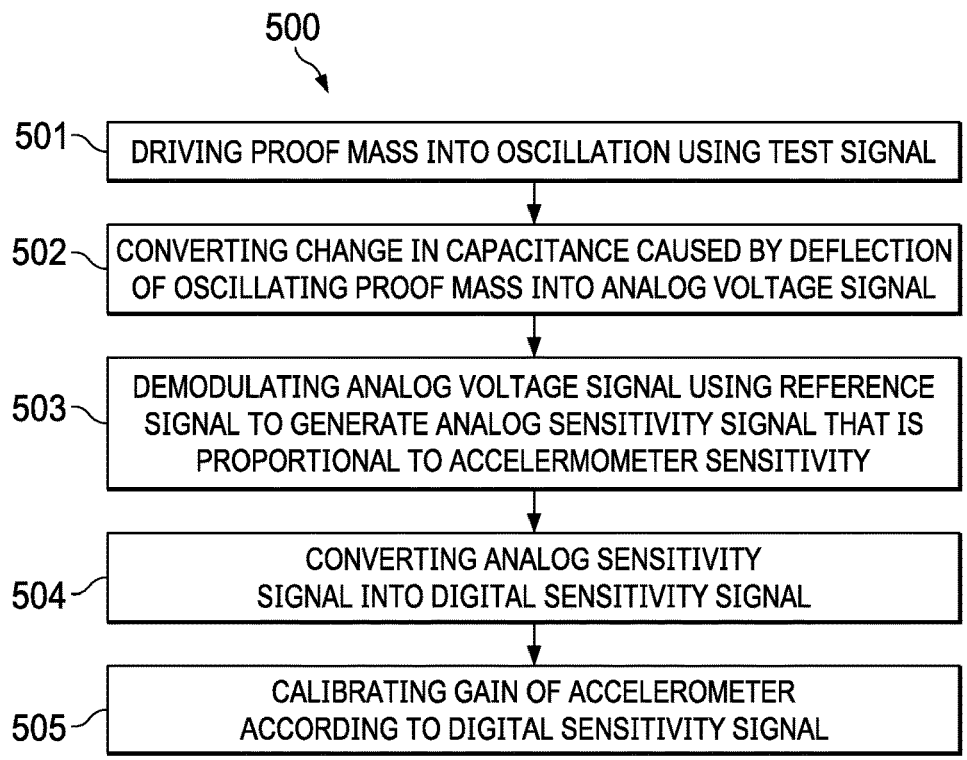
FIG. 5 is flow diagram of a process for continuous calibration of a MEMS based accelerometer, according to an embodiment.

FIG. 5 is flow diagram of a process for continuous calibration of a MEMS based accelerometer, according to an embodiment. Process 500 can be implemented using, for example, electronic system 600 shown in FIG. 6.

Process 500 can begin by driving a proof-mass into oscillation using a test signal having a first frequency (501). For example, a 500 Hz square wave can be used as the test signal. Although any test signal frequency can be used, it is preferable that the test signal frequency be outside the measurement band of the MEMS based accelerometer and also in the flat area of the frequency response curve of the MEMS based accelerometer.

Process 500 can continue by converting a change in capacitance caused by deflection of the oscillating proof-mass into an analog signal (502). For example, a differential C2V converter can be used to perform the conversion into an analog voltage signal.

Process 500 can continue by demodulating the analog signal using a reference signal at the test signal frequency to generate an analog sensitivity signal that is proportional to accelerometer sensitivity (503). For example, in a first processing path a synchronous demodulator can be used to demodulate the analog signal.

Process 500 can continue by converting analog sensitivity signal into a digital sensitivity signal (504). For example, in the first processing path an ADC can be used to convert the analog sensitivity signal into a digital sensitivity signal. The digital sensitivity signal can be stored in, for example, memory or a hardware register.

Process 505 can continue by calibrating the gain of the accelerometer according to the digital sensitivity signal (505). Periodically or based on a trigger event, the gain of the accelerometer can be adjusted according to the value of the digital sensitivity signal stored in memory or the hardware register.

Example System Architecture

Figure 6:
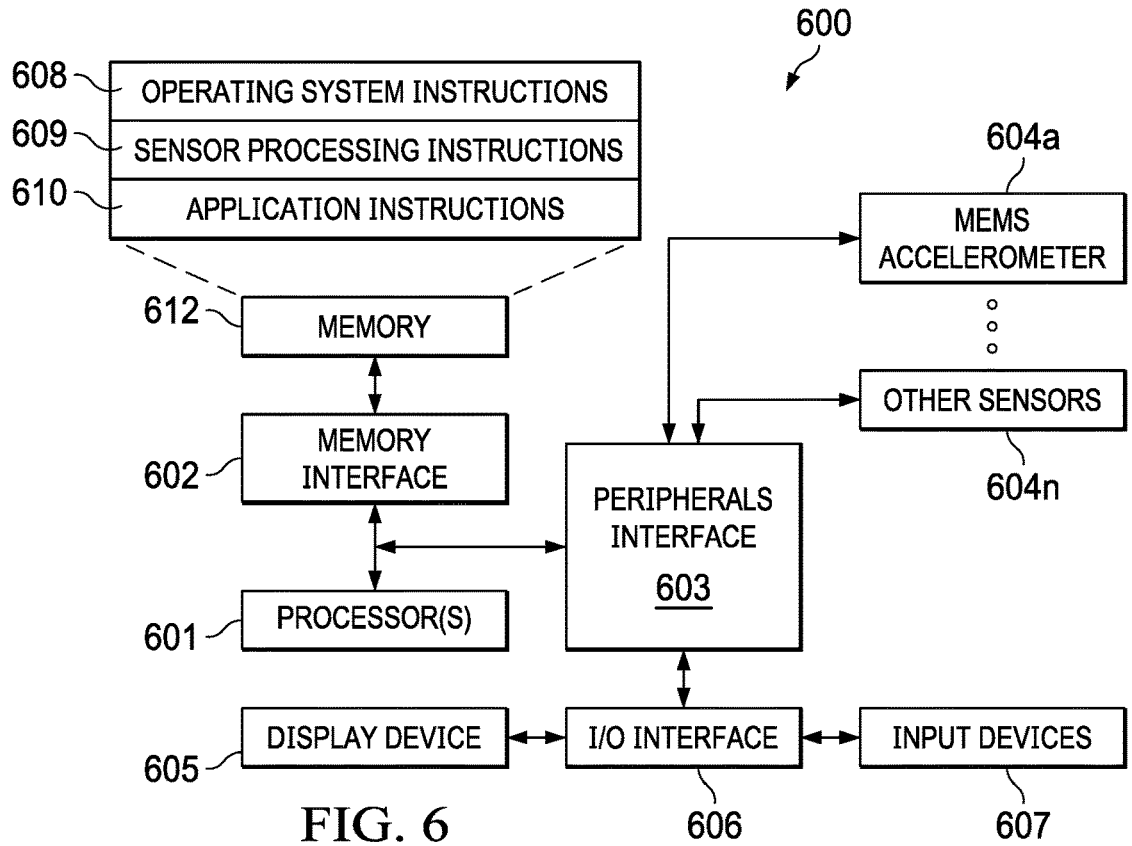
FIG. 6 is a block diagram of an electronic system architecture for implementing the MEMS based accelerometer described in reference to FIGS. 1-5, according to an embodiment.

FIG. 6 is a block diagram of an electronic system architecture for implementing the MEMS based accelerometer described in reference to FIGS. 1-5, according to an embodiment. Architecture 600 can be included in any electronic device that uses motion sensors, including but not limited to: smart phones, tablet computers, wearable devices (e.g., a smart watch) and automotive systems.

Architecture 600 includes processor(s), memory interface 602, peripherals interface 603, motion sensors 604a . . . 604n, display device 605 (e.g., touch screen, LCD display, LED display), I/O interface 606 and input devices 607 (e.g., touch surface/screen, hardware buttons/switches/wheels, virtual or hardware keyboard, mouse). Memory 612 can include high-speed random access memory and/or non-volatile memory, such as one or more magnetic disk storage devices, one or more optical storage devices and/or flash memory (e.g., NAND, NOR).

Memory 612 stores operating system instructions 608, sensor processing instructions 609 and application instructions 612. Operating system instructions 608 include instructions for implementing an operating system on the device, such as iOS, Darwin, RTXC, LINUX, UNIX, WINDOWS, or an embedded operating system such as VxWorks. Operating system instructions 608 may include instructions for handling basic system services and for performing hardware dependent tasks. Sensor-processing instructions 609 perform post-processing on motion sensor data (e.g., averaging) and provide control signals to motion sensors. Application instructions 610 implement software programs that use data from one or more motion sensors 604a . . . 604n, such as navigation, digital pedometer, tracking or map applications. At least one motion sensor 604a is a capacitive-based MEMS accelerometer that operates as described in reference to FIGS. 1-5.

For example, in a navigation application executed on a smart phone, acceleration data is provided by the capacitive-based MEMS accelerometer to processor(s) 601 through peripheral interface 603. Processor(s) 601 execute sensor-processing instructions 609, to perform further processing of the acceleration data (e.g., averaging). Processor(s) 601 execute instructions for various applications running on the smart phone. For example, the acceleration data can be used to determine a more accurate location of the smart phone in a reference coordinate system. The location can be used by the navigation application to perform a variety of navigation functions (e.g., location tracking, route navigation, turn-by-turn instructions). In a fitness application, the more accurate acceleration can be used by a digital pedometer to calculate a more accurate step count and distance traveled. Other applications are also possible (e.g., gaming applications).

While this document contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination. Logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method of calibrating accelerometer sensitivity of a micro-electrical-mechanical system (MEMS) based accelerometer, comprising:

driving a proof mass of the MEMS based accelerometer into oscillation using a drive signal oscillating at a drive frequency;

converting a change in capacitance of the MEMS based accelerometer caused by a deflection of the oscillating proof mass into an analog signal;

demodulating the analog signal using a reference signal oscillating at the drive frequency, the demodulating generating an analog sensitivity signal that is proportional to the accelerometer sensitivity;

converting the analog sensitivity signal into a digital sensitivity signal; and calibrating a gain of the MEMS based accelerometer according to the digital sensitivity signal.

2. The method of claim 1, wherein the drive frequency is within a substantially flat portion of a frequency response of the MEMS based accelerometer and outside a measurement frequency band of the MEMS based accelerometer.

3. The method of claim 1, further comprising:
demodulating the analog signal using a reference signal having a frequency that is higher than the drive signal frequency, the demodulating generating an analog measurement signal that is proportional to sensed acceleration of the MEMS based accelerometer;
converting the analog measurement signal into a digital measurement signal;
filtering the digital measurement signal to attenuate the digital measurement signal at the drive frequency; and
outputting the filtered digital measurement signal as a measurement of the sensed acceleration of the MEMS based accelerometer.

4. The method of claim 3, wherein the filtering includes applying a notch filter to the digital measurement signal to attenuate the digital measurement signal at the drive frequency.

5. The method of claim 1, further comprising:
comparing a stored digital sensitivity signal with the digital sensitivity signal; and
calibrating the gain of the accelerometer based on results of the comparing.

6. A calibration system for calibrating acceleration sensitivity of a micro-electrical-mechanical system (MEMS) based accelerometer, comprising:
a substrate;
a proof mass coupled to the substrate;
a first pair of electrodes coupled to the substrate and configured to sense capacitance variation in response to a deflection of the proof mass;
a second pair of electrodes configured to drive the proof mass into oscillation in response to a drive signal;
one of more circuits configured to:
generate the drive signal;
convert the change in capacitance into an analog signal;
demodulate the analog signal using a reference signal oscillating at a drive frequency, the demodulating generating an analog sensitivity signal that is proportional to the accelerometer sensitivity;
convert the analog sensitivity signal into a digital sensitivity signal; and
calibrate a gain of the MEMS based accelerometer according to the digital sensitivity signal.

7. The system of claim 6, wherein the first and second pairs of electrodes are differential electrodes.

8. The system of claim 6, wherein the second pair of electrodes are lateral comb electrodes.

9. The system of claim 6, wherein the drive frequency is within a substantially flat portion of a frequency response curve of the MEMS based accelerometer and outside a measurement frequency band of the MEMS based accelerometer.

10. The system of claim 6, further comprising:
demodulating the analog signal using a reference signal having a frequency that is higher than the drive signal frequency, the demodulating generating an analog measurement signal that is proportional to sensed acceleration of the MEMS based accelerometer;
converting the analog measurement signal into a digital measurement signal;
filtering the digital measurement signal to attenuate the digital measurement signal at the drive frequency; and
outputting the filtered digital measurement signal as a measurement of the sensed acceleration of the MEMS based accelerometer.

11. The system of claim 10, wherein the filtering includes applying a notch filter to the digital measurement signal to attenuate the digital measurement signal at the drive frequency.

12. The system of claim 6, further comprising:
comparing a stored digital sensitivity signal with the digital sensitivity signal; and
calibrating the gain of the accelerometer based on results of the comparing.

13. An electronic system comprising:
a micro-electrical-mechanical system (MEMS) based accelerometer;
a calibration system for calibrating acceleration sensitivity of the MEMS based accelerometer, the calibration system comprising:
a substrate;
a proof mass coupled to the substrate;
a first pair of electrodes coupled to the substrate and configured to sense capacitance variation in response to a deflection of the proof mass;
a second pair of electrodes configured to drive the proof mass into oscillation in response to a drive signal;
one of more circuits configured to:
generate the drive signal;
convert the change in capacitance into an analog signal;
demodulate the analog signal using a reference signal oscillating at a drive frequency, the demodulating generating an analog sensitivity signal that is proportional to the accelerometer sensitivity;
convert the analog sensitivity signal into a digital sensitivity signal; and
calibrate a gain of the MEMS based accelerometer according to the digital sensitivity signal;
one or more processors;
memory coupled to the one or more processors and storing instructions that when executed by the one or more processors, cause the one or more processors to perform operations comprising:
obtaining acceleration data from the MEMS based accelerometer;
calculating a location of the electronic system or a step count using the acceleration data; and
providing the location or step count to one or more client applications or electronic system components.

14. The electronic system of claim 13, wherein the first and second pairs of electrodes are differential electrodes.

15. The electronic system of claim 13, wherein the second pair of electrodes are lateral comb electrodes.

16. The electronic system of claim 13, wherein the drive frequency is within a substantially flat portion of a frequency response of the MEMS based accelerometer and outside a measurement frequency band of the MEMS based accelerometer.

17. The electronic system of claim 13, further comprising:
demodulating the analog signal using a reference signal having a frequency that is higher than the drive signal frequency, the demodulating generating an analog measurement signal that is proportional to sensed acceleration of the MEMS based accelerometer;

converting the analog measurement signal into a digital measurement signal;

filtering the digital measurement signal to attenuate the digital measurement signal at the drive frequency; and outputting the filtered digital measurement signal as a measurement of the sensed acceleration of the MEMS based accelerometer.

18. The electronic system of claim 17, wherein the filtering includes applying a notch filter to the digital measurement signal to attenuate the digital measurement signal at the drive frequency.

19. The electronic system of claim 13, further comprising:

comparing a stored digital sensitivity signal with the digital sensitivity signal; and calibrating the gain of the accelerometer based on results of the comparing.

\* \* \* \* \*